United States Patent [19]

Mehr

[11] Patent Number: 5,530,295
[45] Date of Patent: Jun. 25, 1996

[54] DROP-IN HEAT SINK

[75] Inventor: Behrooz Mehr, Tempe, Ariz.

[73] Assignee: Intel Corporation, Santa Clara, Calif.

[21] Appl. No.: 451,478

[22] Filed: May 26, 1995

Related U.S. Application Data

[63] Continuation of Ser. No. 174,772, Dec. 29, 1993, abandoned.

[51] Int. Cl.⁶ .......................... H01L 23/28; H01L 23/495
[52] U.S. Cl. .......................... 257/796; 257/675; 257/722; 361/718; 361/723; 165/80.3
[58] Field of Search ........................ 257/712, 796, 257/675, 722; 361/714, 718, 723; 165/80.3

[56] References Cited

U.S. PATENT DOCUMENTS

| | | | |
|---|---|---|---|
| 4,092,697 | 5/1978 | Spaight | 361/386 |
| 4,326,215 | 4/1982 | Suzuki et al. | 257/796 |
| 4,360,141 | 11/1982 | Kensrue | 228/46 |
| 4,415,025 | 11/1983 | Horvath | 165/185 |
| 4,530,003 | 7/1985 | Blair et al. | 257/796 |
| 4,538,168 | 8/1985 | Van Dyk Soerewin | 257/796 |
| 4,603,374 | 7/1986 | Wasielewski | 361/389 |
| 4,605,058 | 8/1986 | Wilins | 165/80.2 |
| 4,771,365 | 9/1988 | Cichocki et al. | 361/387 |
| 4,777,560 | 10/1988 | Herrell et al. | 361/384 |
| 4,833,567 | 5/1989 | Saaski et al. | 361/385 |
| 4,833,766 | 5/1989 | Herrell et al. | 29/157.3 |
| 4,888,637 | 12/1989 | Sway-Tin et al. | 357/81 |
| 5,028,984 | 7/1991 | Ameen et al. | 357/72 |
| 5,105,259 | 4/1992 | McShane et al. | 257/796 |
| 5,172,213 | 12/1992 | Zimmerman | 257/796 |
| 5,180,001 | 1/1993 | Okada et al. | 165/80.4 |
| 5,213,153 | 5/1993 | Itoh | 165/104.33 |
| 5,227,663 | 7/1993 | Patil et al. | 257/796 |
| 5,253,702 | 10/1993 | Davidson et al. | 165/80.4 |
| 5,289,039 | 2/1994 | Ishida et al. | 257/796 |
| 5,345,106 | 9/1994 | Doering et al. | 257/675 |

FOREIGN PATENT DOCUMENTS

| | | | |
|---|---|---|---|
| 60-7155 | 1/1985 | Japan . | |
| 0137042 | 7/1985 | Japan | 257/796 |
| 0039555 | 2/1986 | Japan | 257/796 |
| 0049446 | 3/1986 | Japan | 257/675 |
| 63-47959 | 2/1988 | Japan . | |
| 63-55966 | 3/1988 | Japan . | |
| 0205935 | 8/1988 | Japan | 257/796 |
| 131443 | 2/1989 | Japan . | |
| 159841 | 7/1989 | Japan . | |
| 249457 | 2/1990 | Japan . | |
| 2237055 | 9/1990 | Japan . | |
| 0078246 | 4/1991 | Japan | 257/796 |
| 0097326 | 4/1994 | Japan | 257/675 |
| 1691913 | 11/1991 | U.S.S.R. . | |

OTHER PUBLICATIONS

"High Performance Air Cooled Heat Sinks for Integrated Circuits" Claude Hilbert et al. IEEE Transactions on Conmponents Hybrids, and Manufacturing Technology, vol. 13, No. 4, Dec. 1990.

Cunavelis et al., "External Module Heat Sink Fastened to Board" IBM Technical Disclosure Bulletin, vol. 14, No. 1, Jun. 1971, p. 182.

Almquist et al., "Spring–Clip Mounted Extruded Aluminum Heat Sink", IBM Technical Disclosure Bulletin, vol. 23, No. 12, May 1981, p. 5303.

(List continued on next page.)

*Primary Examiner*—Rolf Hille
*Assistant Examiner*—David Ostrowski
*Attorney, Agent, or Firm*—Blakely, Sokoloff, Taylor & Zafman

[57] ABSTRACT

A heat sink incorporated into an electronic package. The package contains an integrated circuit enclosed by a dielectric housing. Coupled to the circuit is a lead frame which has a plurality of leads that extend from the outer edges of the housing. The heat sink has a bottom surface pressed against the lead frame and an opposite top surface that is exposed to the ambient. The heat sink also has a pair of oblique steps which engage the housing and insure that the sink does not become detached from the package.

3 Claims, 1 Drawing Sheet

OTHER PUBLICATIONS

"Low Profile Heat Sink", IBM Technical Disclosure Bulletin, vol. 28, No. 12, May 1986, pp. 5172–5173.

"Stick–On Heat Sink", Research Disclosure, No. 270, Oct. 1986, 27104.

Conners, P. M., "Variable Area Heat Sink Device" IBM Technical Disclosure Bulletin, vol. 17, No. 4, Sep. 1974, p. 1016.

5,530,295

DROP-IN HEAT SINK

This is a continuation of application Ser. No. 08/174,772 filed Dec. 29, 1993, now abandoned.

BACKGROUND OF THE INVENTION

1. Field of the Invention

The present invention relates to an electronic package for integrated circuits.

2. Description of Related Art

Integrated circuits (ICs) are typically housed within a package that can be mounted to a printed circuit board. A conventional IC package includes an outer housing that encapsulates the integrated circuit and a lead frame that couples the circuit to the printed circuit board. The outer housing is typically constructed from a dielectric material such as a glass filled epoxy. Glass filled epoxies have a relatively low coefficient of thermal conductivity. Consequently a substantial portion of the heat generated by the integrated circuit is transferred to the printed circuit board through the lead frame. The leads of the lead frame are relatively long and create a thermal resistance that may cause excessive junction temperatures in the IC. High junction temperatures may damage or otherwise effect the performance of the circuit.

To improve thermal efficiency, some package designs employ a heat slug that is coupled to the integrated circuit and the housing. The heat slug is typically mounted to the integrated circuit and provides a direct thermal path between the IC and the housing. To assembly such a package, the heat slug is initially coupled to the integrated circuit and encapsulated by an uncured silica filled epoxy. The epoxy is then heated and cured to create a rugged outer housing.

Although heat slugs improve the thermal efficiency of the package, the outer housing material still creates a significant thermal impedance. It would be desirable to have a heat sink which has a surface exposed to the ambient to increase the thermal efficiency of the electronic package. It would also be desirable to have a heat sink, that extends from the circuit die to the top surface of the package, is rigidly attached to the housing and which does not allow moisture to migrate into the die cavity.

SUMMARY OF THE INVENTION

The present invention is a heat sink incorporated into an electronic package. The package contains an integrated circuit enclosed by a dielectric housing. Coupled to the circuit is a lead frame which has a plurality of leads that extend from the outer edges of the housing. The heat sink has a bottom surface pressed against the lead frame and an opposite top surface that is exposed to the ambient. The heat sink also has a pair of oblique steps which prevent detachment from the package and insure that moisture does not enter the die cavity.

The package is constructed by initially attaching the integrated circuit to the lead frame. The heat sink is then placed within a mold. The heat sink has a pair of slots which receive corresponding pins that extend from the mold. The pins and slots align the heat sink within the base of the mold. The lead frame and integrated circuit die are then placed on top of the heat sink. The die, lead frame and heat sink are then enclosed by a mold cover and a dielectric material is injected into the mold cavity. The dielectric is allowed to cure and the mold is removed.

It is therefore an object of the present invention to provide a heat sink, which extends from a circuit die to the top surface of an electronic package.

It is also an object of the present invention to provide a heat sink, that has an exposed top surface, is rigidly attached to the package housing and does not allow moisture to migrate into the die cavity of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
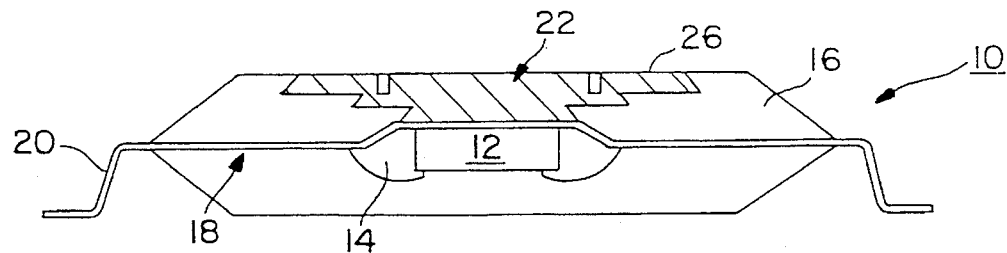
FIG. 1 is a cross-sectional view of a electronic package of/the present invention.

Referring to the drawings more particularly by reference numbers, FIG. 1 shows an electronic package 10 of the present invention. The package 10 contains an integrated circuit die 12 that is located within a die cavity 14 and enclosed by a housing 16. The die 12 is attached to a lead frame 18 that has a plurality of leads 20 which extend from the exterior of the housing 16. The leads 20 are typically soldered to a printed circuit board (not shown) as is known in the art.

Adjacent to the lead frame 18 and die 12 is a heat sink 22. The heat sink 22 has a bottom surface 24 that is in contact with the die paddle of the lead frame 18. The heat sink 22 also has an opposite top surface 26 that is exposed to the ambient. The top surface 26 has a much larger surface area than the bottom surface 24. The large surface area reduces the convective thermal impedance, thereby increasing the rate of convective heat transfer from the heat sink 22. The heat sink 22 is preferably constructed from a thermally conductive material such as a nickel plated copper or anodized aluminum.

Figure 2:
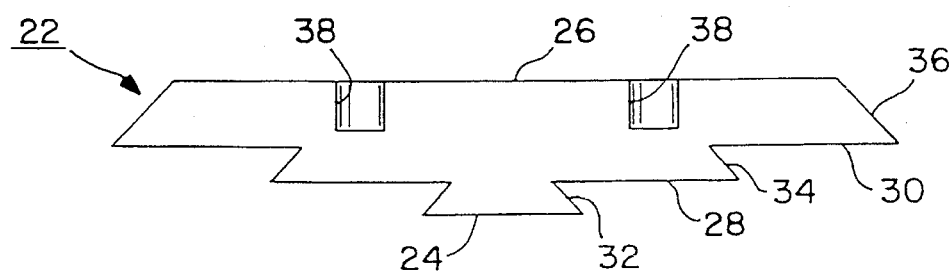
FIG. 2 is an enlarged cross-sectional view of a heat sink of the electronic package.

As shown in FIG. 2, between the top 26 and bottom 24 surfaces of the heat sink 22 are a pair of steps 28 and 30. The steps 28 and 30 have inclined surfaces 32 and 34, respectively. Additionally, the heat sink 22 has an inclined surface 36 that extends from the top surface 26. In the preferred embodiment, the steps are each 0.015 inches deep and the heat sink 22 has an overall depth 0.057.

Referring to FIG. 2, the housing material 16 adjacent to the inclined surfaces 32–36 capture the heat sink 22 and prevent the heat sink 22 from becoming detached from the package 10. Additionally, the steps create a long path, which significantly reduces the amount of moisture migration between the ambient and the die cavity 14 of the package 10. Electronic packages are particularly susceptible to moisture migration when exposed to an ambient pressure greater then the pressure within the die cavity 14. The differential pressure will have a tendency to pump air and any corresponding water into the package. Any fluid within the die cavity may effect the performance of the integrated circuit. The stepped heat sink 22 of the present invention therefore provides a heat sink which has a large exposed top surface, is securely attached to the package housing and does not allow moisture to migrate into the die cavity.

Referring to FIG. 2, the top surface 26 of the heat sink 22 contains a pair of alignment holes 38 which are adapted to receive corresponding mold alignment pins. The holes 38 are preferably 0.025 inches in diameter and have a depth of 0.025 inches.

Figure 3:
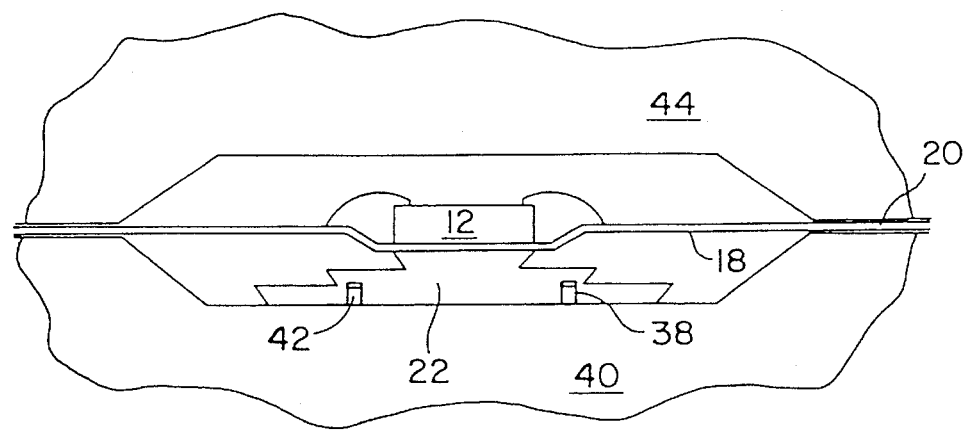
FIG. 3 is a cross-sectional view of the heat sink, die and lead frame within a mold.

As shown in FIG. 3, the package 10 is constructed by initially placing the heat sink 22 into a mold base 40. The base 40 has a pair of alignment pins 42 that extend into the holes 38 and align the heat sink 22 within the mold. The lead frame 18 is bonded to the die 12 and placed onto the heat sink 22. The leads 20 of the lead frame 18 are supported by the outer edge of the mold 40. A mold cover 44 is then attached to the base 40 to enclose the heat sink 22, die and a portion of the lead frame 18. A dielectric material is injected into the mold cavity. The dielectric is allowed to cure and the mold is removed, whereby there is constructed the electronic package of the present invention.

The heat sink 22 is preferably constructed to be slightly taller than the distance between the lead frame 18 and the bottom of the mold 40, so that the heat sink 22 exerts an upward force on the lead frame 18 when the lead frame 18 and sink 22 are placed into the mold 40. The upward force on the lead frame 18 insures that there is a contact pressure between the bottom surface 24 of the heat sink 22 and the lead frame 18 when the housing is cured. The contact pressure reduces the thermal impedance of the interface between the heat sink 22 and lead frame 18, thereby improving the overall thermal performance of the package 10.

Figure 4:
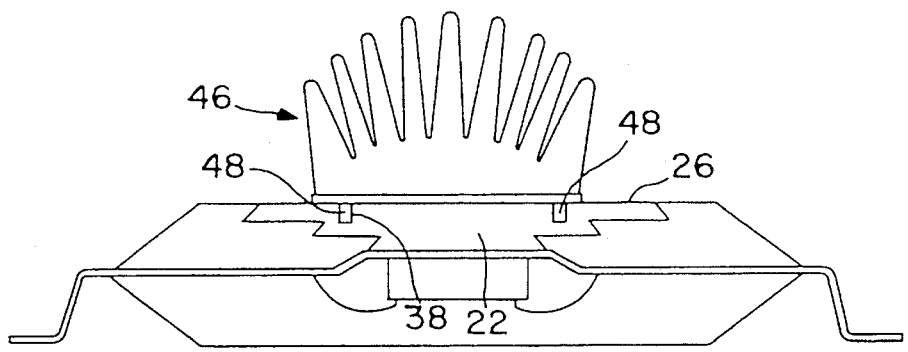
FIG. 4 is a cross-sectional view similar to FIG. 1, showing an alternate embodiment of the package with a heat fin attached to the heat sink.

FIG. 4 shows an alternate embodiment of the package, wherein a heat fin 46 is attached to the top surface 26 of the heat sink 22. The heat fin 46 may have pins 48 that are inserted into the alignment holes 38 and attach the fin 46 to the heat sink 22.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a housing;

an integrated circuit within said housing;

a lead frame coupled to said integrated circuit;

a heat sink embedded within said housing, said heat sink having a top surface, a first outwardly tapered surface that extends to a first edge, a first step surface that extends inward from said first edge essentially parallel with said top surface, a second outwardly tapered surface that extends from said first step surface to a second edge, a second step surface that extends inward from said second edge essentially parallel with said top surface, and a third outwardly tapered surface that extends from said second step surface to a third edge.

2. The heat sink as recited in claim 1, wherein said heat sink is attached to said lead frame.

3. The package as recited in claim 1, further comprising a heat fin that is attached to said heat sink.

* * * * *